United States Patent [19]
Nagata et al.

[11] Patent Number: 5,418,395
[45] Date of Patent: May 23, 1995

[54] SEMICONDUCTOR LIGHT EMITTING DEVICE

[75] Inventors: Hisao Nagata; Shuhei Tanaka, both of Osaka, Japan

[73] Assignee: Nippon Sheet Glass Co., Ltd., Japan

[21] Appl. No.: 40,851

[22] Filed: Mar. 31, 1993

[30] Foreign Application Priority Data

Apr. 7, 1992 [JP] Japan .................. 4-085413
Apr. 16, 1992 [JP] Japan .................. 4-096746
Jan. 8, 1993 [JP] Japan .................. 5-001569

[51] Int. Cl.[6] .................. H01L 27/12; H01L 29/04; H01S 3/16
[52] U.S. Cl. .................. 257/103; 257/49; 257/85; 257/90; 372/44
[58] Field of Search .................. 257/103, 90, 85, 49; 372/44

[56] References Cited

U.S. PATENT DOCUMENTS

| | | | |
|---|---|---|---|
| 4,069,492 | 1/1978 | Pankove | 257/79 |
| 4,863,877 | 9/1989 | Fan et al. | 148/DIG. 84 |
| 5,036,373 | 7/1991 | Yamasaki | 257/103 |
| 5,239,190 | 8/1993 | Kowasaki | 257/98 |

OTHER PUBLICATIONS

Blakeslee et al, "Growth of Polycrustalline GaAs for Solar Cell Applications", IBM J. Res. Dev., vol. 22, No. 4, Jul. 1978.
Cohen et al, "Schottky barrier behavior in polycrystal GaAs", J. Vac. Sci. Technol., 17(5), Sep./Oct. 1980.

*Primary Examiner*—Jerome Jackson
*Attorney, Agent, or Firm*—Lorusso & Loud

[57] ABSTRACT

A semiconductor light emitting diode (LED) has a pn junction, a pin junction or a similar junction formed in a polycrystalline layer with a large grain size. The LED is produced on an amorphous, ceramic, polycrystalline or monocrystalline substrate according to a crystalline growth method and light is emitted by injecting an electric current into the junction.

6 Claims, 16 Drawing Sheets

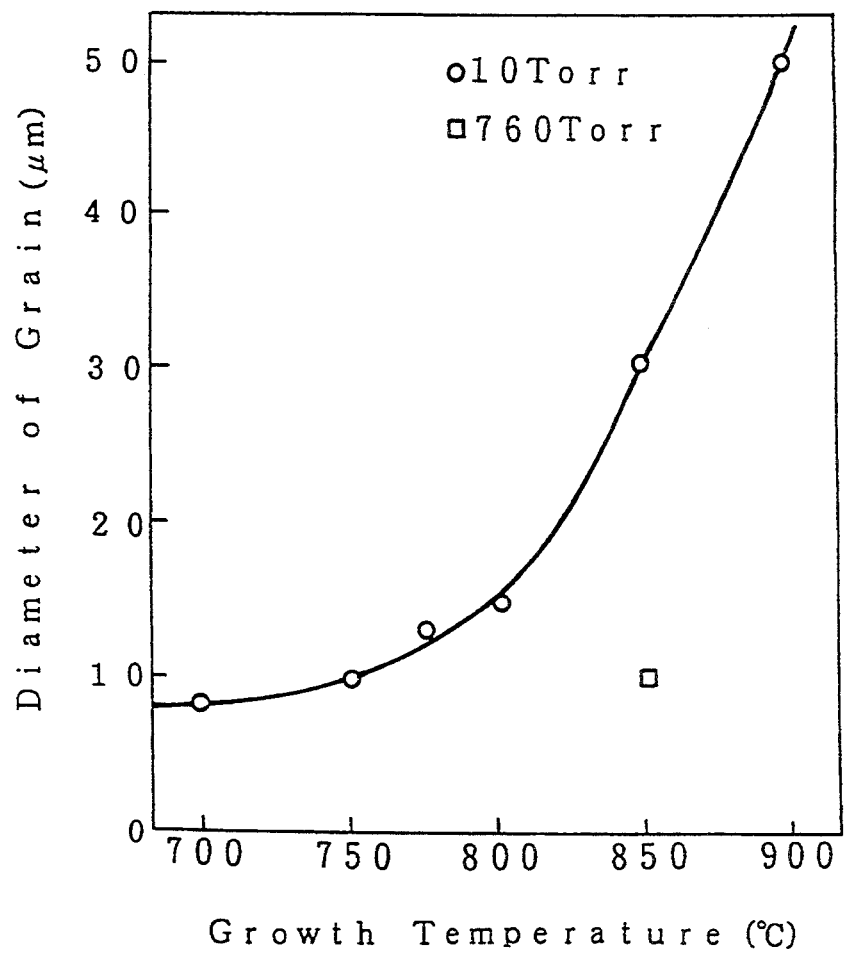

SEMICONDUCTOR LIGHT EMITTING DEVICE

FIELD OF THE INVENTION

The present invention relates to an injection type semiconductor light emitting device. It relates especially to a light emitting diode (LED) on a substrate which is more economical than a conventional compound semiconductor substrate such as an amorphous substrate, a polycrystalline substrate or the like.

PRIOR ART

A conventional light emitting diode (LED) includes a compound semiconductor (GaAs, GaP, AlGaAs, etc.) and the semiconductor contains a p-n junction, in which a p-type semiconductor and an n-type semiconductor adjoin each other or a pin junction in which a nondoped semiconductor is provided between an n-type semiconductor and a p-type semiconductor. Carriers are injected into the junction by applying forward voltage to the junction and an emission phenomenon occurring at recombination of carriers is utilized.

Such an LED has conventionally been produced by the epitaxial growth of a semiconductor compound such as GaAs, AlGaAs, InP, InGaAsP which is lattice-matched on a single crystal substrate, such as GaAs and InP. Conventional crystal growth methods include a liquid phase epitaxy method (LPE), a metal organic chemical vapor deposition method (MOCVD), a vapor phase epitaxy method (VPE) and a molecular beam epitaxy method (MBE).

However, compound semiconductor substrates including GaAs and InP are expensive compared with Si and the like and, therefore, the cost of a light emitting device prepared on such substrates is high. Besides, though compound semiconductor substrates are conventionally produced according to the horizontal Bridgeman technique or the Czochralski technique, it is difficult to obtain a substrate of good quality and a large area. For example, in the case of a GaAs substrate, only a wafer with a maximum diameter of 7.6 cm is on the market. An LED array for an LED printer and an image sensor needs a length of 10 cm or more. Accordingly, in order to produce an array of such length it has been necessary to align minute chips (array).

SUMMARY OF THE INVENTION

An object of the present invention is to provide a semiconductor light emitting device capable of being formed on a cheap substrate, solving the above conventional problems.

Another object of the present invention is to provide a semiconductor light emitting device, using a substrate cheaper than a compound semiconductor.

Moreover, a further object of the present invention is to provide a light emitting device array of a large area which needs no alignment of minute chips (array).

The above objects of the present invention are accomplished by the present invention.

The present invention is a semiconductor light emitting device including a substrate of a material free of epitaxial growth, a polycrystalline semiconductor having at least one junction selected from a p-n junction, a pin junction and similar junctions on said substrate, and electrodes set on each of the polycrystalline p-type semiconductor and an n-type semiconductor.

The substrate of the invention is a material free of epitaxial growth and is a material selected from inorganic materials and metallic materials, e.g. glass and ceramic.

The substrate comprising a material free from the occurrence of epitaxial growth has a structure which is amorphous, polycrystalline or monocrystalline.

The substrate comprising a material free from the occurrence of epitaxial growth can be a metal, said metal also being used as one of the semiconductor electrodes.

The polycrystalline semiconductor preferably makes ohmic contact with electrodes and has at least a junction selected from a pn junction, a pin junction and similar junctions.

The substrate comprising a material free from the occurrence of epitaxial growth is preferably transparent to the emission wavelengths of the polycrystalline semiconductor and emission is preferably conducted through the substrate.

The electrically conductive material between the substrate and the semiconductors can be used as one of the semiconductor electrodes.

At least one of the electrode set on the p-type semiconductor and that on the n-type semiconductor can be composed of an electrically conductive material which is transparent to the emission wavelengths of the polycrystalline semiconductor.

At least one of the electrode set on the p-type semiconductor and that on the n-type semiconductor can be composed of an electrically conductive material which is opaque to the emission wavelengths of the polycrystalline semiconductor.

At least one of the electrode set on the p-type semiconductor and that on the n-type semiconductor can form part of the polycrystalline semiconductor or the substrate is exposed and emission is conducted through the exposed portion.

One of the polycrystalline semiconductor electrodes can be plural electrodes which are insulated from each other and emission is conducted from at least one of the side of the polycrystalline semiconductor corresponding to the plural electrodes and that of the substrate.

A substrate comprising a material free from epitaxial growth may be produced from an amorphous, ceramic, polycrystalline or monocrystalline material fabricated on a plate-like amorphous, ceramic, polycrystalline or monocrystalline substance.

Here, "similar junctions" refers to a Schottky contact which forms where a semiconductor makes contact with a metal.

A polycrystalline device is characteristically inferior to a monocrystalline device; however, it can further function as a light emitting diode when the grain size of the semiconductor is several tens $\mu$m. Accordingly, if the grain size of each semiconductor is several tens $\mu$m or more, a polycrystalline device which is by no means inferior to a monocrystalline device can be obtained. Needless to say, a polycrystalline device with a smaller grain size can also function as a light emitting diode.

A typical example of an amorphous substrate is glass, and glass of a large area is easily available. Accordingly, a light emitting device array with a length of 10 cm or more for a printer and an image sensor can be cut off from a substrate and alignment of minute chips (array) conventionally needed becomes unnecessary.

One characteristic of the present invention is that a polycrystalline semiconductor functioning as a light emitting device is formed on a substrate comprising a material free from the occurrence of epitaxial growth. Here, a substrate comprising a material free from the occurrence of epitaxial growth need not be monocrystalline, and amorphous and polycrystalline materials can be used. Accordingly, since such materials as glass and ceramic can be used, quite a broad range of materials can be utilized.

In the practice of the present invention, the largest problem is to produce a polycrystalline layer comprising grains (single crystals in a polycrystalline film) with a large size on a substrate comprising a material free from the occurrence of epitaxial growth which is either amorphous, ceramic or polycrystalline. If a grain with a large size can be formed, it can function as a semiconductor light emitting device.

When a polycrystalline layer is formed on a polycrystalline substrate, its grain size is influenced by the grain size of the substrate. For example, when a polycrystalline layer is formed on a quartz glass substrate, which is an amorphous substrate, according to an MOCVD method, its grain size varies according to growth conditions. For example, the grain size can be controlled by controlling grain growth temperature, grain growth pressure, growth rate, material supply rate and carrier gas flow rate. For example, the higher the growth temperature is, or the lower the growth pressure is, the larger the obtained grain size becomes. According to a preliminary experiment for the growth of GaAs under a pressure of 10 Torr at 850° C., a polycrystalline layer comprising grains with a diameter of 30 $\mu$m or more could be obtained.

FIG. 22 shows the relationship between grain size of GaAs on quartz glass and growth temperature under a pressure of 10 Torr. for 1 hr. Under the pressure of 10 Torr., the higher the growth temperature is, the larger the diffusion length of such materials as sources, decomposition-intermediates from the sources adsorbed on substrate, As atoms or Ga atoms, becomes. As a result, grain size becomes large proportional to the rise of temperature, being about 30 $\mu$m at 850° C. On the other hand, the grain size is at most about 10 $\mu$m at 850° C. under atmospheric pressure (760 Torr.).

The first growth of crystal (grain) was carried out under 10 Torr. and 850° C. for all Examples shown in FIG. 22. FIG. 22 suggests that the first growth should be carried out at high temperature to get a large grain size. However, we selected the above condition (10 Torr. and 850° C.) because the surface layer composed of grains became rough at high growth temperatures.

An attempt was made to form a semiconductor layer at atmospheric pressure without the first growth. In this experiment, good current-voltage characteristics suitable for diodes could not be obtained and visible light could not be observed. The experiment confirmed that the size of the grain is the important factor in obtaining polycrystalline semiconductors which will function as a light emitting device. However, the minimum grain size for a light emitting device was not determined.

In FIG. 22 the sum of the grain volumes is considered to be the same for each experiment because the introduced volume of sources introduced into the chamber was the same for each experiment. Therefore grain size and the distance between grains grown at higher temperatures are larger than those of grains grown at lower temperatures (Grains grow up in a vertical direction). The grain size becomes equal to distance between grains as the second growth of crystal is carried out on the initial grains as nuclei for the growth. With the sample having the large distance between grains, the grains grew in size in the second growth. On the other hand, with the sample wherein the first growth was at 76 Torr., 700° C. or 760 Torr., 800° C. and the grain diameter was about 10 $\mu$m, the grains almost came into contact with next adjacent grains. In this latter case, the grain obtained by the second growth had a diameter of about 10 $\mu$m.

As described above, it becomes possible to produce a polycrystalline layer comprising grains with a size larger than the size obtained according to the above preliminary experiment by use of optimum conditions in a MOCVD method. If p-type and n-type AlGaAs layers grow on the substrate, they will become polycrystalline layers with a grain size as large as or larger than that of the polycrystalline layer used as a substrate. When the grain size of p-type and n-type AlGaAs layers corresponds to the size of a light emitting diode, the same properties as those of a monocrystalline device can be obtained. Conversely, when the grain size is smaller than that corresponding to such a diode, the device will have more than a few grain boundaries. The boundaries will have non-radiative recombination of carriers. However, this does not mean the non-radiative recombination of all carriers. Radiative recombination is controlled according to grain sizes. Namely, though a little inferior to a monocrystalline light emitting diode in its functions, a device sufficiently functioning as a light emitting diode can be obtained.

As glass to be used as a substrate in the present invention, not only quartz glass but also multicomponent glass and crystallized glass can be used. Metals can also be used as a substrate in the present invention. In addition, films comprising various oxides including $SiO_2$, nitrides such as SiN, carbides such as SiC, and metals formed by a CVD method, a sputtering method, a vapor deposition method and the like, may be formed on the various substrates. When light is to be emitted from the sides of the substrate, however, the substrate must be transparent or semitransparent to the emitted light.

In the foregoing, AlGaAs has been described as a semiconductor material; however, there is no need for limitation to AlGaAs. InP, InGaAsP, ZnS, ZnSe and CdTe can also be used as semiconductor materials.

In the present invention, an MBE method or a VPE method can be used instead of an MOCVD method for the growth of a semiconductor film on the substrate.

Epitaxial growth of crystals over the whole surface of a substrate does not occur on the following substrates: an amorphous, ceramic or polycrystalline substrate; a monocrystalline substrate whose crystalline structure is different from the semiconductor material to be formed; and a crystalline substrate whose crystalline structure is the same as that of the semiconductor material to be formed but whose lattice constant is quite different. However, minute crystals formed on a substrate at the beginning of growth function as crystalline nuclei and the nuclei grow to become a polycrystalline layer by selecting the growth conditions.

If the size of each grain of a polycrystalline layer is larger than each device size, the light emitting device formed on the polycrystalline layer is almost equivalent to a monocrystalline device. Accordingly, it becomes possible to provide a semiconductor light emitting device by using a substrate cheaper than a conventional compound semiconductor substrate. Moreover, since glass of a large area, which is a typical example of an amorphous substrate, is easily available, it becomes possible to increase greatly the size of an integrated device, which has previously been restricted by size of available substrates.

According to the present invention, it has become possible to provide a semiconductor light emitting device by using a substrate cheaper than a conventional compound semiconductor substrate. In addition, since glass of a large area, which is a typical amorphous substrate, is easily available, it has become possible to form a light source (LED array) for an LED printer on a substrate.

BRIEF DESCRIPTION OF THE DRAWINGS

FIG. 22 is a graph of the relation between grain size of GaAs on quartz glass and growth temperature under the pressure of 10 Torr, for 1 hr.

EXAMPLES

Examples of the present invention will now be described with reference to the drawings.

Example 1

Figure 1:
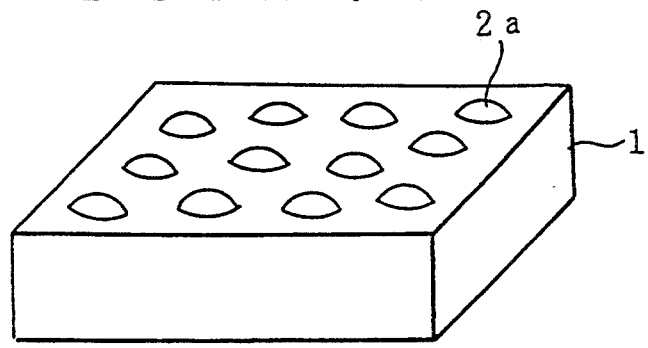
FIGS. 1(a)–1(c) are schematic views of a process for producing an AlGaAs polycrystalline light emitting diode on a quartz glass substrate described in Example 1.
Figure 1:
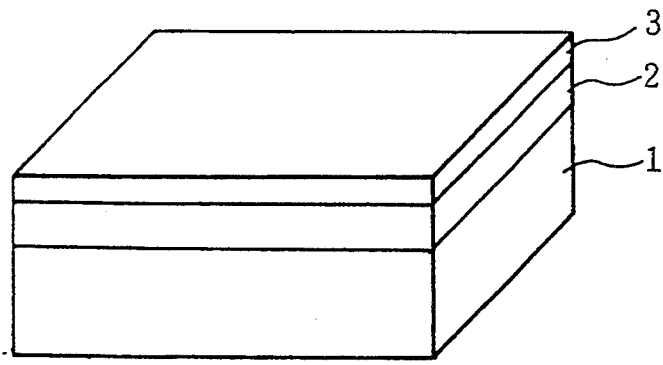
Figure 1:
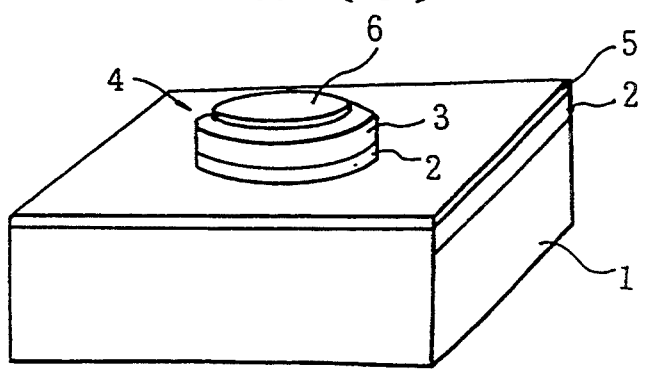
Figure 2:
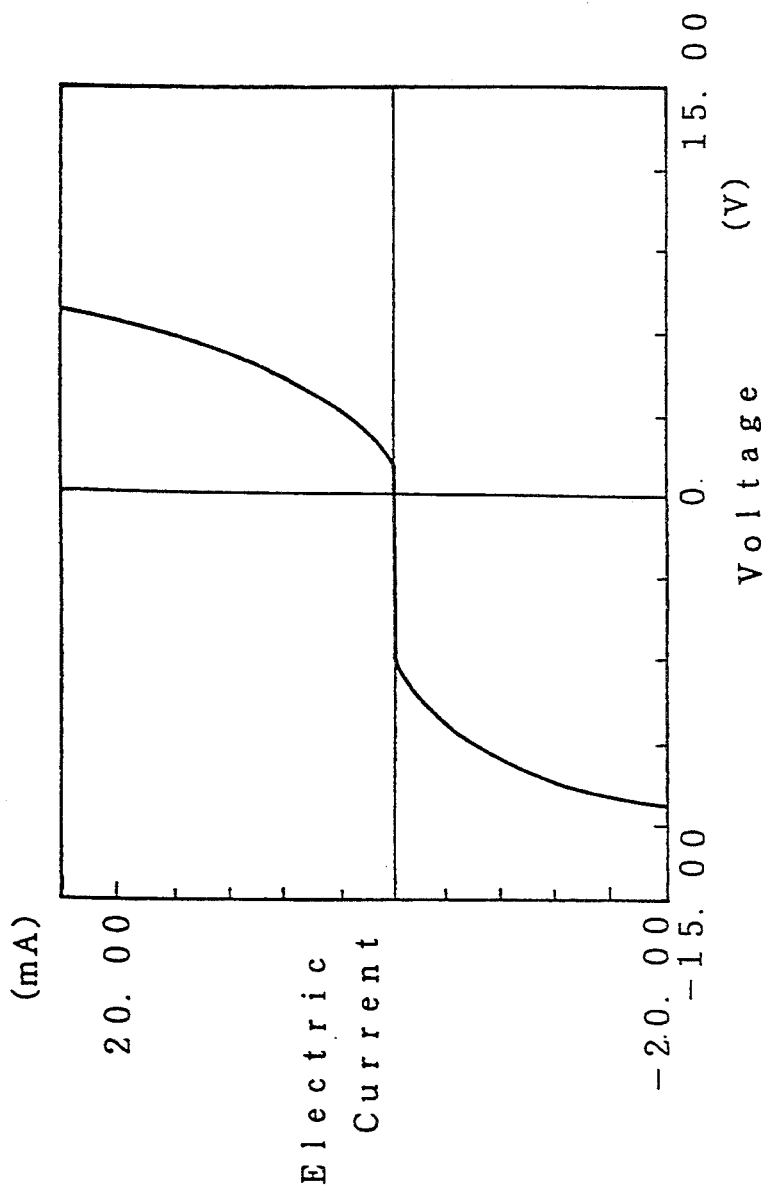
FIG. 2 is a graph showing the current-voltage characteristics of an AlGaAs polycrystalline light emitting diode fabricated on a quartz glass substrate as described in Example 1.
Figure 3:
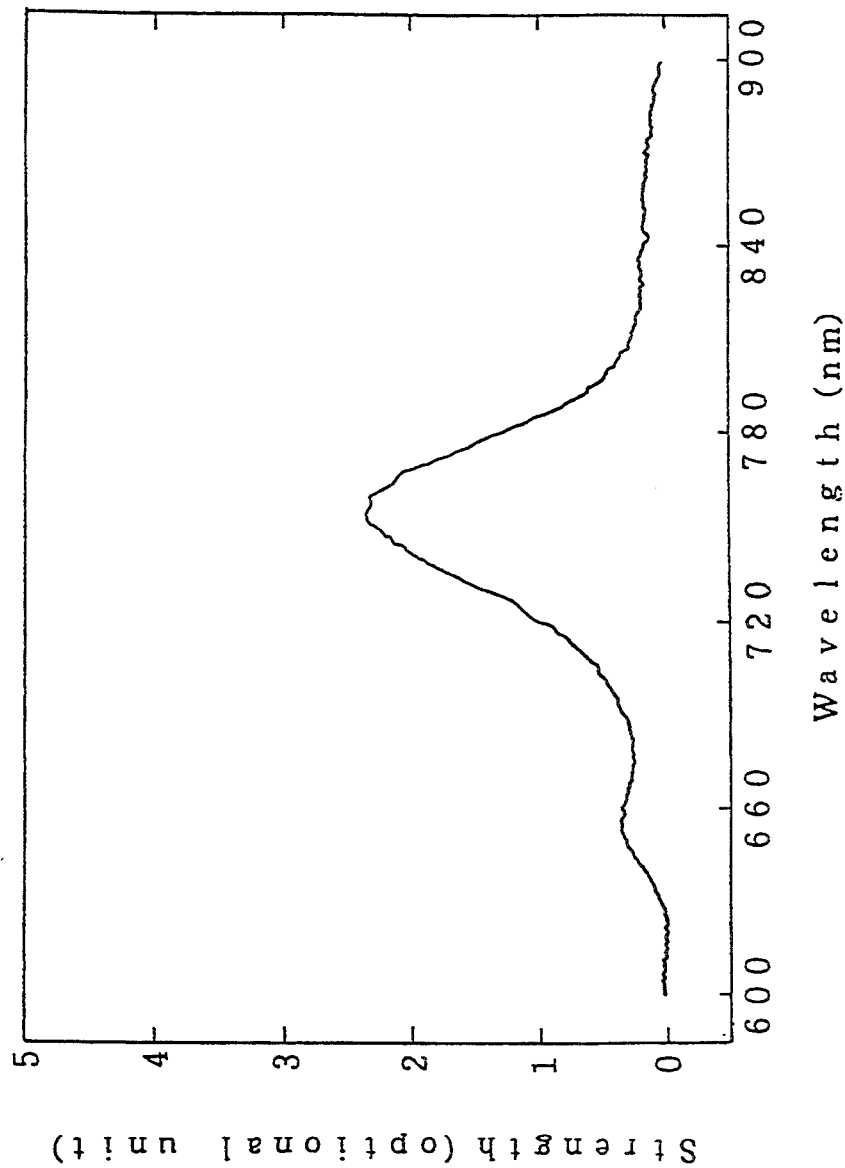
FIG. 3 is a graph of an emission spectrum upon applying an electric current to an AlGaAs polycrystalline light emitting diode fabricated on a quartz glass substrate described in Example 1.

As an example of the present invention, the production of a p-n junction AlGaAs polycrystalline light emitting diode on a quartz glass substrate according to an MOCVD method will be described. FIG. 1 shows a process for producing an AlGaAs polycrystalline light emitting diode fabricated on a quartz glass substrate. FIG. 2 is a graph showing the current-voltage characteristics of an AlGaAs polycrystalline light emitting diode fabricated on a quartz glass substrate. FIG. 3 is a graph of an emission spectrum when a forward current is applied to an AlGaAs polycrystalline light emitting diode fabricated on a quartz glass substrate.

In FIG. 1, etching by hydrofluoric acid was carried out as a pretreatment of quartz glass plate 1 used as a substrate. In order to prevent the abnormal occurrence of crystalline nuclei due to impurities, the quartz glass plate was introduced into an MOCVD chamber and exposed to HCl at 1,000° C. for 15 minutes so that its surface was cleansed. The temperature of the quartz glass plate was lowered to 850° C. and a first crystalline growth was carried out under a pressure of 10 Torr. Here, as the group III sources trimethyl-gallium and trimethyl-aluminum were used, as the group V source arsine (AsH3) was used, as p-type dopant dimethylzinc was used, as n-type dopant hydrogen selenide was used and as a carrier gas hydrogen was used. The ratio of the group V source, to the group III sources represented by a molar flow per unit time of the group V source to a molar flow per unit time of the group III sources was 40 and these sources and dimethylzinc were supplied for 1 hour.

Consequently, grains 2a with a diameter of about 30 μm, composed of a p-type AlGaAs (x=0.43) grew on the quartz glass 1 (FIG. 1(a)). In succession to the first growth, under atmospheric pressure, a p-type polycrystalline AlGaAs (x=0.43) layer 2 with the same composition as grains 2a was grown at 800° C. and an n-type polycrystalline AlGaAs (x=0.43) layer 3 was grown at 850° C. (FIG. 1(b)). By this 2-step growth a polycrystalline AlGaAs layer was obtained. The second growth was conducted in order to obtain a p-type polycrystalline AlGaAs layer 2 or an n-type polycrystalline AlGaAs (x=0.43) layer 3 having excellent characteristics.

The structure of the device produced is shown in FIG. 1(c). A mesa structure 4 of 70 μmφ was formed by chemical etching. A p-type electrode 5 and an n-type electrode 6 were deposited on the etched surface and a part of the mesa structure 4, respectively. According to measurement of the current-voltage characteristics of the device, an excellent commutation property as shown in FIG. 2 was obtained. The breakdown voltage (voltage at which an electric current starts to flow according to the application of the reverse bias in the current-voltage characteristics of a diode) was 6–8 V. The device emitted light only when a forward current was applied. Visible light could be observed through the polycrystalline film and the substrate. The ratio of the emission intensity of the glass side to that of the semiconductor side was about 1:1. FIG. 3 shows an emission spectrum at the time when an electric current of 10 mA was applied. Two peaks could be observed around 650 nm and around 750 nm. The peak of 650 nm is due to the band edge emission of AlGaAs (x=0.43) and that of 750 nm is attributed to a deep level emission.

In the present Example, a first growth was carried out at a temperature of 850° C. under a pressure of 10 Torr. It is apparent, however, that the conditions of first growth are not restricted to those conditions described above. For example, the size of grains 2a which grew at a temperature of 800° C. under a pressure of 10 Torr for an hour was about 15 μm, and the size of grains 2a which grew at a temperature of 900° C. was about 50 μm. At a temperature of 850° C., it was about 20 μm under a pressure of 76 Torr and about 10 μm under a pressure of 760 Torr (atmospheric pressure).

A sample which had been produced without the above-described first growth did not show such excellent current-voltage characteristics as those shown in FIG. 2, and only resistant components in grain boundaries appeared. As a result, the emission responsive to application of an electric current was very weak. The size of grains 2a of the sample was about 5 μm. Accordingly, it is apparent that the size of grains 2a is an important factor in the function of a light emitting diode.

Example 2

Figure 4:
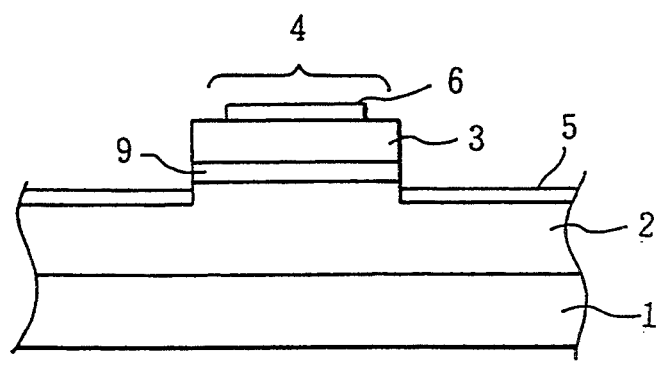
FIG. 4 is a schematic cross-sectional view of a pin-type AlGaAs polycrystalline light emitting diode prepared on a quartz glass substrate described in Example 2.

As an example of the present invention, the production of a pin-junction light emitting diode using polycrystalline AlGaAs as a semiconductor material on a quartz glass substrate, formed by an MOCVD method, will be described with reference to FIG. 4. Using a quartz glass plate 1 as a substrate, etching with hydrofluoric acid was carried out as a pretreatment. In order to prevent abnormal occurrence of crystalline nuclei due to impurities, the quartz glass plate was introduced into an MOCVD chamber and exposed to HCl at 1,000 ° C. for 15 minutes so that its surface was cleansed. The temperature of the quartz glass plate was lowered to 850° C. and a first crystalline growth was carried out under a pressure of 10 Torr. Here, as the group III sources were used trimethyl-gallium and trimethyl-aluminum, as the group V source arsine (AsH3) was used and as a p-type dopant dimethylzinc was used, as an n-type dopant hydrogen selenide was used and as a carrier gas hydrogen was used. The ratio of the group V source to the group III sources represented by a molar flows per unit time was 40 and the source materials and dimethylzinc were supplied for 1 hour. As a result, grains (not shown) with a diameter of about 30 μm composed of p-type AlGaAs (x=0.3) grew on the quartz glass. Subsequently, under an atmospheric pressure, 2 μm of a p-type polycrystalline AlGaAs (x=0.43) layer 2 and 0.3 μm of a undoped polycrystalline AlGaAs (x=0.3) layer 9 were grown at 800° C., and further an n-type polycrystalline AlGaAs (x=0.43) layer 3 was grown at 850° C.

The structure of the device produced is the same as shown in FIG. 1. A mesa structure 4 of 70 μmφ was prepared by chemical etching. A p-type electrode 5 and an n-type electrode 6 were deposited on the etched surface and a part of the mesa structure 4 respectively. Measurement of the current and voltage characteristic of the device showed the same excellent commutation property and the characteristics of a diode, as seen in FIG. 2. The breakdown voltage (voltage at which an electric current starts to flow upon the application of reverse bias in the current-voltage characteristics of a diode) was 6–8 V. The device emitted light only when an electric current was forward injected. It could be observed on both sides of the substrate. The ratio of the emission intensity of the glass side to that of the semiconductor side was about 1:1. The emission spectrum upon current injection showed two peaks around 715 nm and around 775 nm.

Example 3

Figure 5:
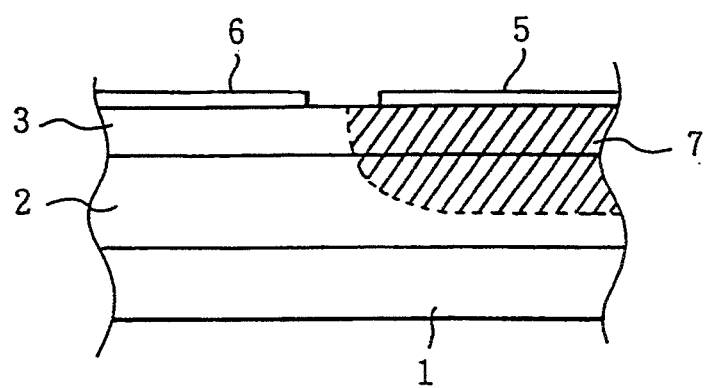
FIG. 5 is a schematic cross-sectional view of an AlGaAs polycrystalline light emitting diode fabricated on a quartz glass substrate in Example 3.

FIG. 5 is a schematic cross-sectional view of a p-n junction AlGaAs polycrystalline light emitting diode fabricated on a quartz glass substrate 1. Using a quartz glass plate 1 as a substrate, etching with hydrofluoric acid was carried out as a pretreatment. In order to prevent the abnormal occurrence of crystalline nuclei due to impurities, the quartz glass plate was introduced into an MOCVD chamber and exposed to HCl at 1,000° C. for 15 minutes so that its surface was cleansed. The temperature of the quartz glass plate was lowered to 850° C. and a first crystalline growth was carried out under a pressure of 10 Torr. Similarly, as in Example 1, the ratio of the group V source to the group III sources represented by a molar flow per unit time of the group V source to a molar flow per unit time of the group III sources was 40 and the source materials and p-type dopant were supplied for 1 hour.

As a result, grains (not shown) with a diameter of about 30 μm composed of p-type AlGaAs (x=0.43) grew on the quartz glass substrate 1. Subsequently, under atmospheric pressure, a p-type polycrystalline AlGaAs (x=0.43) layer 2 was grown at 800° C., and an n-type polycrystalline AlGaAs (x=0.43) layer 3 was grown at 850° C. respectively.

A Si₃N₄ layer (not shown) was deposited, using the CVD method, on the substrate. A diffusion window was opened on the Si₃N₄ layer photolithographically. Zn was diffused through the window on parts of AlGaAs layers 2 and 3 by a closed tube method. For the Zn diffusion a Ga/As/Zn solid solution with a composition ratio of 5/50/40 was used as a diffusion source and the diffusion was conducted at 700° C. for an hour. The Zn diffusion length in AlGaAs polycrystalline layers 2 and 3 was almost the same as that in an AlGaAs epitaxial layer.

As shown in FIG. 5, after removing the Si₃N₄ layer with the window a p-type electrode 5 was deposited on the Zn diffusion region 7 (part with oblique lines in FIG. 5) and a n-type electrode 6 was deposited on a non-diffusion region. According to the measurement of the current-voltage characteristics of the device, the same commutation properties as shown in FIG. 2 were obtained. The device emitted light only when an electric current was injected forward. Visible light emission was observed on both sides of the substrate. The ratio of the emission intensity of the glass side to that of the semiconductor side was about 1:1.

Example 4

A pin-junction AlGaAs polycrystalline light emitting diode formed by diffusion of a quartz glass substrate will be described. A quartz glass plate substrate was preheated by etching with hydrofluoric acid. In order to prevent the abnormal occurrence of crystalline nuclei due to impurities, the quartz glass plate was introduced into an MOCVD chamber and exposed to HCl at 1,000° C. for 15 minutes so that its surface was cleansed. The temperature of the quartz glass plate was lowered to 850° C. and a first growth was carried out under a pressure of 10 Torr. As in Example 2, the ratio of the group V sources to the group III sources, represented by a molar flow per unit time of the group V sources to a molar flow per unit time of the group III sources, was 40 and the sources and p-type dopant were supplied for 1 hour. Consequently, grains with a diameter of about 30 μm composed of a p-type AlGaAs (x=0.43) grew to form a layer on the quartz glass. Subsequently, under atmospheric pressure, a 2 μm p-type polycrystalline AlGaAs (x=0.43) layer and a 0.3 μm undoped polycrystalline AlGaAs (x=0.3) layer were grown at 800° C., and further a n-type polycrystalline AlGaAs (x=0.43) layer was grown at 850° C.

A Si₃N₄ layer was deposited on the substrate using a CVD method. A diffusion window was opened in the Si₃N₄ layer photolitho-graphically. Zn was diffused through the window on a part of AlGaAs using a closed tube method. The Zn diffusion was carried out under the same conditions as in a monocrystalline AlGaAs and the diffusion length was almost the same as that in the monocrystalline AlGaAs. After removing the Si₃N₄ layer, a p-type electrode was deposited on a Zn diffusion region and a n-type electrode on a non-diffusion region, respectively. In measurement of the current-voltage characteristics of the device, the same commutation properties as shown in FIG. 2 were obtained. The device emitted light only when a forward current was induced. The ratio of the emission intensity of the glass side to that of the semiconductor side was about 1:1.

Example 5

Figure 6:
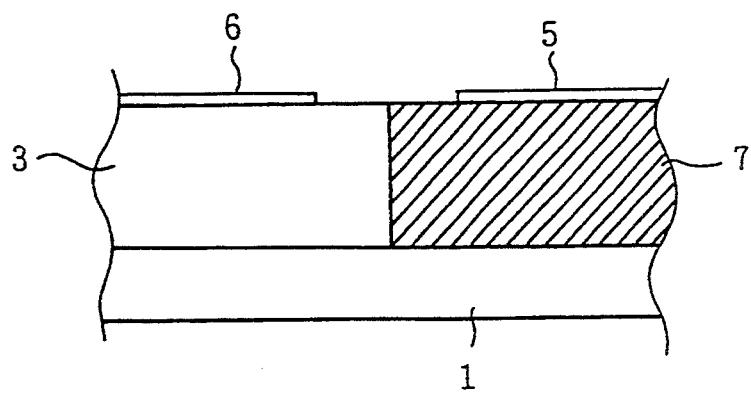
FIG. 6 is a schematic cross-sectional view of an AlGaAs polycrystalline light emitting diode fabricated on a quartz glass substrate with a junction prepared by diffusion as described in Example 5.

Preparation of an AlGaAs polycrystalline light emitting diode on a quartz glass substrate, employing diffusion, will be described with reference to FIG. 6, which is a schematic cross-sectional view of a light emitting diode produced according to the present Example. Using a quartz glass plate 1 as a substrate, etching by hydrofluoric acid was carried out as a pretreatment. In order to prevent the abnormal occurrence of crystalline nuclei due to impurities, the quartz glass plate was introduced into an MOCVD chamber and exposed to HCl at 1,000° C. for 15 minutes so that its surface was cleansed. The temperature of the quartz glass plate was lowered to 850° C. and a first growth was carried out under a pressure of 10 Torr. As in Example 1, the ratio of the group V sources to the group III sources, represented by molar flows per unit time, was 40 and the sources were supplied for 1 hour. As a result, grains (not shown) with a diameter of about 30 μm composed of n-type AlGaAs (x=0.43) grew on the quartz glass 1. Subsequently, under atmospheric pressure, a 3 μm n-type polycrystalline AlGaAs (x=0.43) layer 3 was grown at 800° C.

A Si₃N₄ layer (not shown) was deposited on the substrate using a CVD method. A diffusion window was opened in the Si₃N₄ layer photolitho-graphically. Zn was diffused through the window on a part of an AlGaAs layer 3 according to a closed tube method. When Zn diffusion was carried out under the same conditions as for a monocrystalline AlGaAs layer, the diffusion length was almost the same as that in the monocrystalline one. After the Si₃N₄ layer with a window used as a diffusion mask was removed a p-type electrode 5 was deposited on the Zn diffusion region 7 and an n-type electrode 6 on a non-diffusion region, respectively. In measurement of the current-voltage characteristics of the device, the same commutation properties as shown in FIG. 2 were obtained. The device emitted light only when a forward current was injected. Visible light emission could be observed between the electrode 5 and the electrode 6 and also from the glass side. The ratio of the emission intensity of the glass side to that of the semiconductor side was about 1:1.

Example 6

Preparation of a p-n junction AlGaAs polycrystalline light emitting diode on a quartz glass substrate with a chromium film will be described with reference to the schematic cross-sectional view of FIG. 7. On a quartz glass plate 1 was formed a Cr film 8 with a thickness of about 50 nm, and it was used as a substrate. The transmittance of the substrate was about 50% at 650 nm. The temperature of the substrate was raised to 800° C. in an MOCVD chamber. As in Example 1, the ratio of the molar flow per unit time of the group V sources to the molar flow per unit time of the group III sources was 40 and sources were supplied for 1 hour under a pressure of 10 Torr. As a result, grains (not shown) with a diameter of about 20 μm composed of p-type AlGaAs (x=0.43) grew on the Cr film 8. Subsequently, under atmospheric pressure, a p-type polycrystalline AlGaAs (x=0.43) layer 2 was grown at 800° C. and an n-type polycrystalline AlGaAs (x=0.43) layer 3 at 850° C., respectively.

Figure 7:
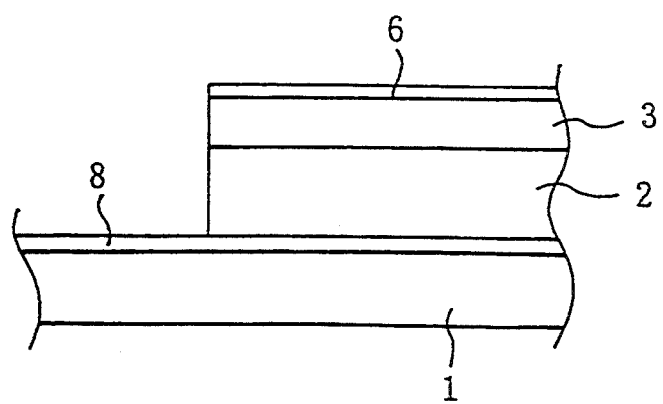
FIG. 7 is a schematic cross-sectional view of an AlGaAs polycrystalline light emitting diode fabricated on a quartz glass substrate covered with a chromium film in Example 6.

As shown in FIG. 7, parts of the grown polycrystalline AlGaAs layers 2 and 3 were etched by etchant containing sulfuric acid until reaching the Cr film 8 and an n-type electrode 6 was deposited on the n-type polycrystalline AlGaAs layer 3. The Cr film 8 functions as an ohmic electrode for the p-type polycrystalline AlGaAs layer 2. Evaluation of the current-voltage characteristics of the device showed excellent p-n characteristics as in FIG. 2. This device also functioned as a light emitting diode, as in the above Examples. Light emission could be observed from both the glass side and the semiconductor side, and their intensity ratio was about 1:5.

Example 7

Figure 8:
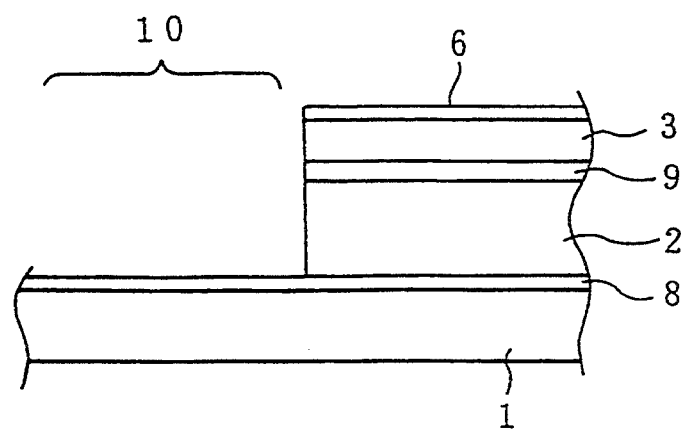
FIG. 8 is a schematic cross-sectional view of a pin-junction AlGaAs polycrystalline light emitting diode fabricated on a quartz glass substrate covered with a chromium film described in Example 7.

Production of a pin junction AlGaAs polycrystalline light emitting diode on a quartz glass substrate with a chromium film will be described with reference to FIG. 8. On a quartz glass plate 1 was fabricated a Cr film 8 with a thickness of about 50 nm according to a sputtering method, and it was used as a substrate. The transmittance of the substrate was about 50% at 650 nm. The temperature of the substrate was raised to 800° C. in an MOCVD chamber. As in Example 1, the ratio of the molar flow per unit time of the group V sources to the molar flow per unit time of the group III sources was 40 and sources and p-type dopant were supplied for 1 hour under a pressure of 10 Torr. As a result, grains (not shown) with a diameter of about 20 $\mu$m composed of p-type AlGaAs (x=0.43) grew on the Cr film 8. Subsequently, under atmospheric pressure, a p-type polycrystalline AlGaAs (x=0.43) layer 2 and an undoped polycrystalline AlGaAs (x=0.43) layer 9 were grown at 800° C. and an n-type polycrystalline AlGaAs (x=0.43) layer 3 at 850° C., respectively.

Parts 10 of the AlGaAs layers 2, 9 and 3 were etched using etchant containing sulfuric acid until reaching the Cr film 8 and a n-type electrode 6 was deposited on the n-type polycrystalline AlGaAs layer 3. The Cr film 8 functions as an ohmic electrode for the p-type polycrystalline AlGaAs layer 2. According to an evaluation of the current-voltage characteristics, excellent pin properties were shown as in FIG. 2. The device functioned as a light emitting diode in the same manner as those in the above Examples. Visible light emission could be observed from both the glass side and the semiconductor side, and their intensity ratio was about 1:5.

Example 8

Figure 9:
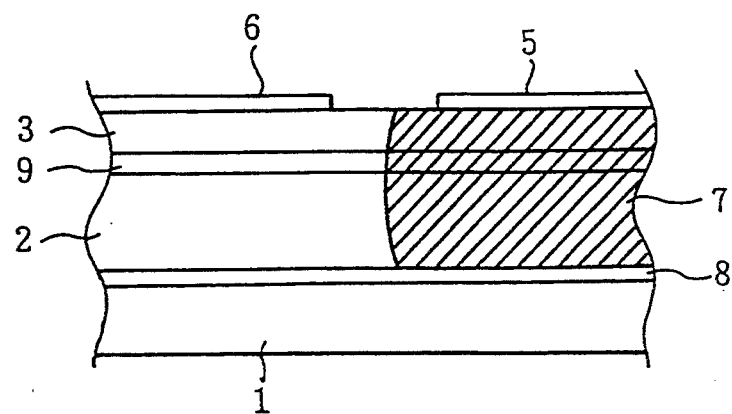
FIG. 9 is a schematic cross-sectional view of a pin-junction AlGaAs polycrystalline light emitting diode fabricated on a quartz glass substrate covered with a chromium film employing Zn diffusion in Example 8.

Production of a pin junction AlGaAs polycrystalline light emitting diode on a quartz glass substrate with a chromium film employing a Zn diffusion method will be described with reference to FIG. 9. On a quartz glass plate 1 was prepared a Cr film 8 with a thickness of about 50 nm according to a sputtering method, and it was used as a substrate. The transmittance of the substrate was about 50% at 650 nm. The temperature of the substrate was raised to 800° C. in an MOCVD chamber. As in Example 1, the ratio of the molar flow per unit time of the group V sources to the molar flow per unit time of the group III sources was 40 and sources and p-type dopant were supplied for 1 hour under a pressure of 10 Torr. As a result, grains (not shown) with a diameter of about 20 $\mu$m composed of p-type AlGaAs (x=0.43) grew on the Cr film 8. Subsequently, under atmospheric pressure, a p-type polycrystalline AlGaAs (x=0.43) layer 2 and an undoped polycrystalline AlGaAs (x=0.43) layer 9 were grown at 800° C. and an n-type polycrystalline AlGaAs (x=0.43) layer 3 at 850° C., respectively.

A $Si_3N_4$ layer (not shown) was deposited using a CVD method on the substrate. A diffusion window was opened in the $Si_3N_4$ layer photolitho-graphically. Zn was diffused through the window on a part of AlGaAs layers 3, 9 and 2 according to a closed tube method. For the Zn diffusion, a Ga/As/Zn solid solution with a composition ratio of 5/50/40 was used as a diffusion source and the diffusion was conducted at 700° C. for an hour. The Zn diffusion length in AlGaAs polycrystalline layers 3, 9 and 2 was almost the same as that in an AlGaAs epitaxial layer. As shown in FIG. 9, the diffusion was conducted until reaching the Cr film 8, and a p-type electrode 5 was deposited on the Zn diffusion region 7 (part with oblique lines in FIG. 9) and an n-type electrode 6 was deposited on a non-diffusion region respectively. In measurement of the current-voltage characteristics of the device, the same commutation properties as shown in FIG. 2 were obtained. The device emitted light only when a forward current was fed to the diode. Visible light emission could be observed on both sides of the substrate. The ratio of emission intensity of the glass side to that of the semiconductor side was about 1:1.

The thickness of the Cr film 8 in the above Examples 6–8 was adjusted so that the transmittance at the emission wavelengths became 10% or more.

Example 9

Figure 10:
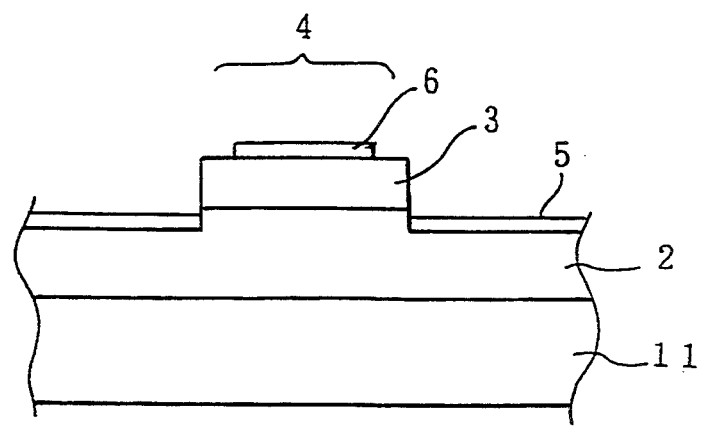
FIGS. 10(a) and 10(b) are schematic views of an AlGaAs polycrystalline light emitting diode fabricated on a multicomponent glass substrate described in Example 9.
Figure 10:
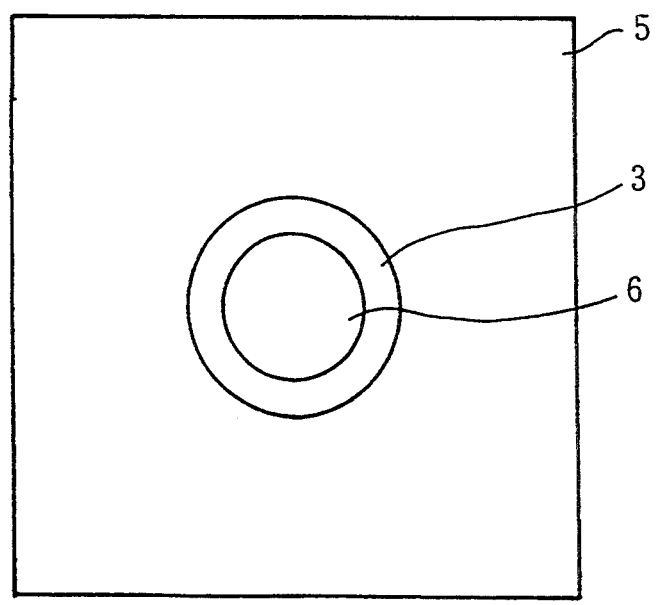

This example illustrates use of a multicomponent glass as a substrate. FIGS. 10(a) and 10(b) are schematic views of an AlGaAs polycrystalline light emitting diode fabricated on a multicomponent glass substrate; FIG. 10(a) is its sectional view and FIG. 10(b) is its plan view. The glass used as a substrate is composed of silicon dioxide, aluminum oxide and calcium oxide as main components and contains a very small amount of titanium dioxide, zirconium dioxide and diphosphorus pentoxide. The softening point of the glass is 991° C., that for annealing is 797° C. and that for strain distortion is 748° C.

Etching by dilute hydrofluoric acid was carried out as a pretreatment of the multicomponent glass substrate 11. The multicomponent glass substrate was introduced into an MOCVD chamber. The temperature of the multicomponent glass substrate was raised to 850° C. and a first growth was carried out under a pressure of 10 Torr. Here, as the group III sources were used trimethyl-gallium and trimethyl-aluminum, as the group V source was used arsine ($AsH_3$). Dimethylzinc was used as a p-type dopant and hydrogen selenide was used as an n-type dopant. As a carrier gas was used hydrogen. In a first growth, the ratio of the group V sources to the group III sources was 40 and growth time was 1 hour. As a result, grains (not shown) with a diameter of about 30 $\mu$m composed of p-type AlGaAs (x=0.43) grew on the glass substrate 11. In succession to the above first growth, under atmospheric pressure, a p-type polycrystalline AlGaAs (x=0.43) layer 2 was grown at 800° C. and an n-type polycrystalline AlGaAs (x=0.43) layer 3 at 850° C., respectively. In the 2-step growth, a second growth was carried out in order to obtain a p-type AlGaAs layer 2 or an n-type AlGaAs layer 3 having excellent properties.

Subsequently, a mesa structure 4 of 70 $\mu$m was formed by chemical etching. A p-type electrode 5 and an n-type electrode 6 were deposited on the etched surface and a part of the mesa structure 4, respectively. In measurement of the current-voltage characteristics of the device, excellent commutation properties as shown in FIG. 2 were obtained. The breakdown voltage (voltage at which an electric current starts to flow according to the application of the reverse bias in the current-voltage characteristics of a diode) was 6–8 V. The device emitted light only when a forward current was injected. Visible light emission could be observed on both sides of the substrate. The ratio of the emission intensity of the glass side to that of the semiconductor side was about 1:1. In measurement of an emission spectrum at injection current of 10 mA, two peaks could be observed, around 645 nm and around 730 nm, as in the case of the emission spectrum shown in FIG. 12. The peak at 645 nm is attributed to the band edge emission of AlGaAs (x=0.43) and that at 730 nm is due to a deep level emission.

According to the comparison between the emission peak wavelengths of the light emitting diode described in Example 1 and those of the present Example, peak wavelength of the light emitting diode of the present Example fabricated on the multicomponent glass appears at shorter wavelengths. The multicomponent glass substrate 11 used in the present Example has a thermal expansion coefficient of $47.5 \times 10^{-7} K^{-1}$. On the other hand, the thermal expansion coefficient of the quartz glass substrate 1 of Example 1 is $5.5 \times 10^{-7} K^{-1}$, and that of a GaAs layer is $6.4 \times 10^{-6} K^{-1}$. Accordingly, it is apparent that a light emitting diode on multicomponent glass has a smaller thermal distortion remaining in the polycrystalline layer than that on a quartz glass substrate. It can be said that the differences of emission peak wavelengths were caused by the differences between the thermal expansion coefficients of the substrates.

Example 10

Using a multicomponent glass substrate 11 described in Example 9, an AlGaAs polycrystalline light emitting diode having a pin junction described in Example 2 was produced.

Example 11

Using a multicomponent glass substrate 11 described in Example 9, an AlGaAs polycrystalline light emitting diode having a p-n junction, employing the Zn diffusion described in Example 3, was produced.

Example 12

Using a multicomponent glass substrate 11 described in Example 9, an AlGaAs polycrystalline light emitting diode having a pin junction, employing the Zn diffusion described in Example 4, was fabricated.

Example 13

Using a multicomponent glass substrate 11 described in Example 9, an AlGaAs polycrystalline light emitting diode having a p-n junction was produced by changing n-type semiconductor to a p-type, by diffusion as described in Example 5.

Example 14

Using a multicomponent glass substrate 11 on which a Cr film was fabricated according to a sputtering technique as described in Example 9, an AlGaAs polycrystalline light emitting diode having a p-n junction as described in Example 6 was produced.

Example 15

Using a multicomponent glass substrate 11 on which a Cr film was formed according to a sputtering technique as described in Example 9, an AlGaAs polycrystalline light emitting diode having a pin junction as described in Example 7 was produced.

Example 16

Using a multicomponent glass substrate 11 on which a Cr film was formed according to a sputtering technique described in Example 9, an AlGaAs polycrystalline light emitting diode having a pin junction employing the diffusion as described in Example 8 was fabricated.

Figure 12:
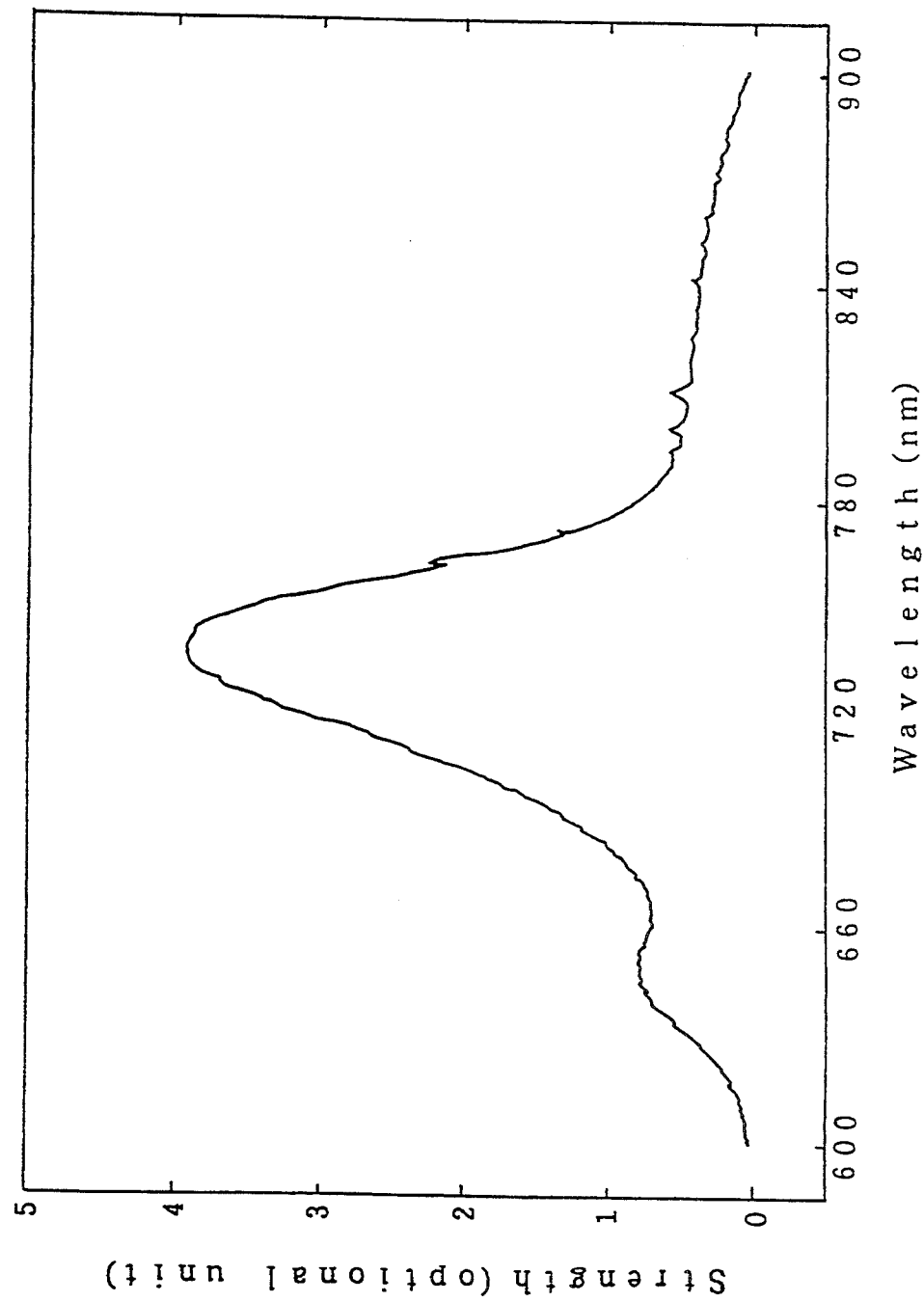
FIG. 12 is a graph of an emission spectrum at the time an electric current is applied to an AlGaAs polycrystalline light emitting diode fabricated on a GaAs substrate covered with a $SiO_2$ film, as described in Example 17.

Measurement of the current-voltage characteristics of the AlGaAs polycrystalline light emitting diodes produced in Examples 10–16, demonstrated that excellent commutation properties as shown in FIG. 2 were obtained. The breakdown voltage for all of Examples 10–16 was within the range of 6–8 V. As in Example 9, the device emitted light only when a forward current was injected. Visible light emission could be observed on both sides of the substrate. The ratio of the emission intensity from the glass side to that from the semiconductor side was about 1:1. Further, as a result of measurement emission spectra with an injection current of 10 mA as in Example 9, two peaks could be observed around 645 nm and around 730 nm, as shown in FIG. 12.

EXAMPLE 17

Figure 11:
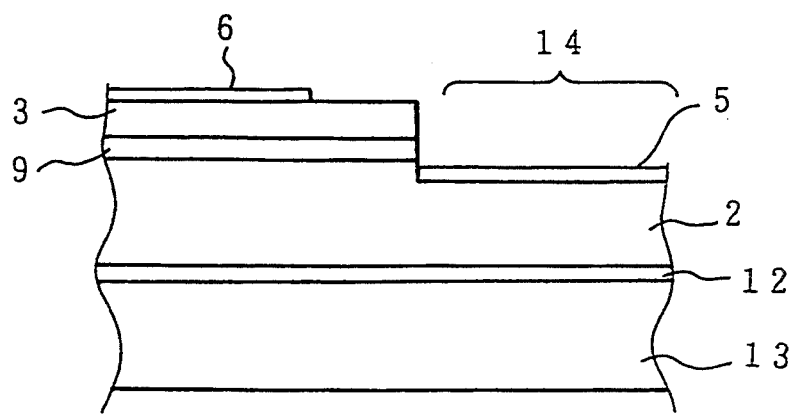
FIGS. 11(a) and 11(b) are schematic cross-sectional views of an AlGaAs polycrystalline light emitting diode produced by employing a monocrystalline GaAs substrate on which a $SiO_2$ film is prepared as described in Example 17.
Figure 11:
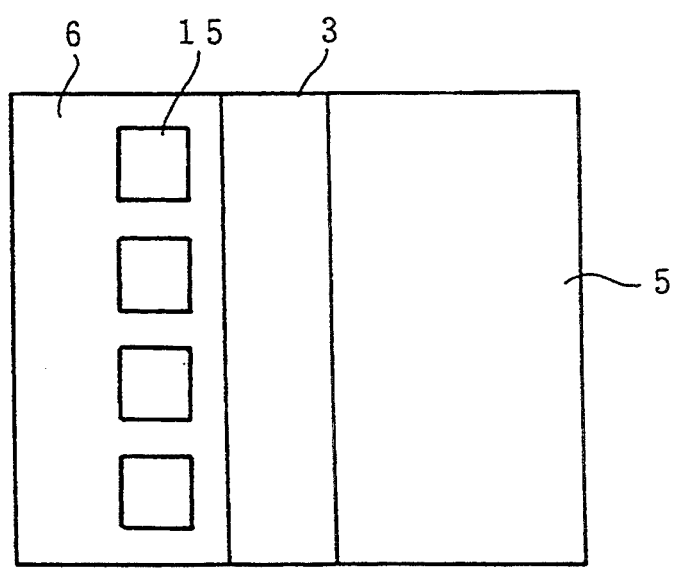

The production of a polycrystalline AlGaAs light emitting diode using a monocrystalline GaAs substrate, on which a 0.5 μm SiO$_2$ film was deposited using a CVD technique, will be described with reference to FIG. 11. Incidentally, it is apparent from a preliminary experiment that the 0.5 μm SiO$_2$ film insulates the diode from the substrate electrically and that the crystalinity of the substrate was not seen at the surface. A monocrystalline GaAs substrate 13 on which a SiO$_2$ film 12 had been fabricated was introduced into an MOCVD chamber and exposed to HCl at 1,000° C. for 15 minutes so that the surface of the SiO$_2$ film 12 was cleansed. The temperature of the monocrystalline GaAs substrate was lowered to 850° C. and a first growth was carried out under a pressure of 10 Torr. Here, as the group III sources were used trimethyl-gallium and trimethyl-aluminum, as the group V source was used arsine (AsH$_3$) and as a carrier gas was used hydrogen. The ratio of the group V source to the group III source was 40 and the sources were supplied for 1 hour. As a result, grains (not shown) with a diameter of about 30 μm composed of p-type AlGaAs (x=0.3) grew on the SiO$_2$ film 12. In succession to the above first crystalline growth, under atmospheric pressure, 2 μm of a p-type polycrystalline AlGaAs (x=0.43) layer 2 and 0.3 μm of an undoped polycrystalline AlGaAs (x=0.43) layer 9 were grown at 800° C., and further an n-type polycrystalline AlGaAs (x=0.43) layer 3 was grown at 850° C.

A step 14 was formed in the surface using chemical etching in order to expose the p-type polycrystalline AlGaAs layer 2. A p-type electrode 5 was deposited on the part exposed by etching and an n-type electrode 6 was deposited on the n-type polycrystalline AlGaAs layer 3. Measurement of the current and voltage characteristics of the device showed excellent commutation properties, i.e. the characteristics of a diode as in FIG.

2, and the breakdown voltage was 6–8 V. The device emitted light only when a forward current was injected. Visible light emission was observed between the electrode 5 and the electrode 6 and through windows 15 opened on the electrode 6 (FIG. 11(b)). Upon current injection, a spectrum having peaks around 645 nm and around 750 nm as shown in FIG. 12 was obtained. The peak at 645 nm corresponds to the band edge of AlGaAs (x=0.43) and that at 730 nm is a deep level emission.

Example 18

Figure 13:
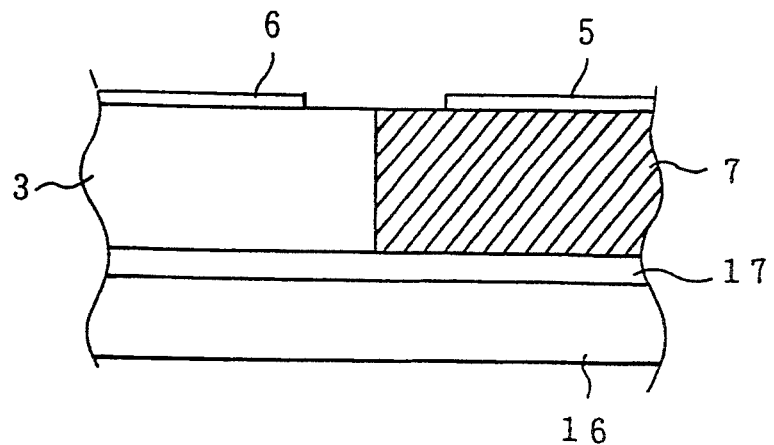
FIG. 13 is a schematic cross-sectional view of an AlGaAs polycrystalline light emitting diode fabricated on a silicon substrate subjected to thermal oxidization described in Example 18.

A polycrystalline AlGaAs light emitting diode was fabricated on a monocrystalline silicon substrate whose surface was oxidized using a thermal oxidization method. FIG. 13 is a drawing explaining the present Example and is a schematic cross-sectional view of a light emitting diode. On the surface of a silicon substrate 16 was formed an oxidized film 17 of about 1 $\mu$m by water vapor oxidation (1,100° C.). The substrate 16 was introduced into an MOCVD chamber. In order to prevent the abnormal occurrence of crystalline nuclei due to impurities, it was exposed to HCl at 1,000° C. for 15 minutes so that its surface was cleansed. The temperature of the monocrystalline silicon substrate was lowered to 850° C. and a first growth was carried out under a pressure of 10 Torr. As in Example 1, the molar ratio of the group V source to the group III source was 40 and sources of arsine, trimethyl-gallium, trimethyl-aluminum and hydrogen selenide were supplied for 1 hour. As a result, grains (not shown) with a diameter of about 30 $\mu$m composed of n-type AlGaAs (x=0.43) grew on the SiO$_2$ film 17. Subsequently, under atmospheric pressure, 3 $\mu$m of an n-type polycrystalline AlGaAs (x=0.43) layer 3 was grown at 800° C.

A Si$_3$N$_4$ layer (not shown) was deposited on the substrate using the CVD method. A diffusion window was opened in the Si$_3$N$_4$ layer photolitho-graphically. Zn was diffused through the window on a part of the n-type polycrystalline AlGaAs layer 3 using a closed tube method. For the Zn diffusion, a Ga/As/Zn solid solution with a composition ratio of 5/50/40 was used as a source and the diffusion was conducted at 700° C. for 1 hour. The Zn diffusion length in the polycrystalline AlGaAs layer 3 was almost the same as that in an AlGaAs epitaxial film. As shown in FIG. 13, a p-type electrode was deposited on Zn diffusion region 7 (part with oblique lines in FIG. 13) and an n-type electrode 6 was deposited on a non-diffusion region. In measurement of the current-voltage characteristics of the device, the same commutation properties as shown in FIG. 2 were obtained. The device emitted light only when a forward current was injected. Visible light emission was observed between the electrode 5 and the electrode 6.

Example 19

Figure 14:
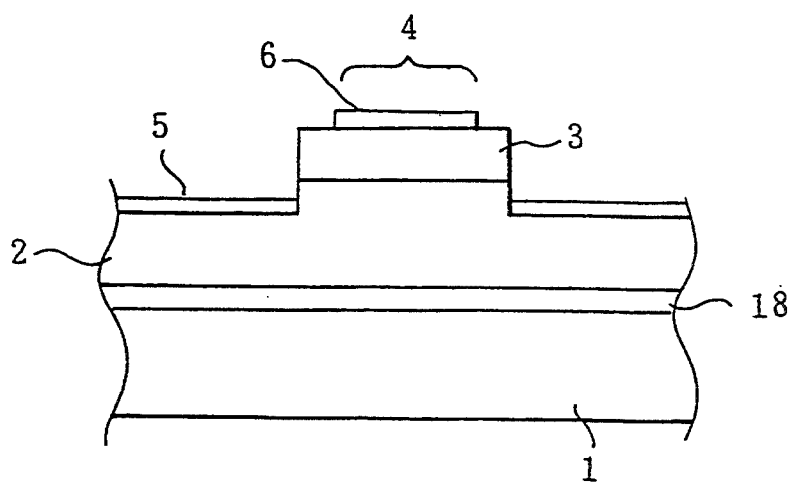
FIG. 14 is a schematic cross-sectional view of a p-n junction AlGaAs polycrystalline light emitting diode fabricated on a quartz glass substrate on which a $Si_3N_4$ film is formed as described in Example 19.

This example illustrates production of a p-n junction AlGaAs polycrystalline light emitting diode on a quartz substrate covered with a Si$_3$N$_4$ film deposited using a CVD method. FIG. 14 is a schematic cross-sectional view of the light emitting diode of the present example. A quartz glass substrate 1 was coated with a 0.3 $\mu$m of a Si$_3$N$_4$ film 18 using a plasma CVD method. The substrate 1 was introduced into an MOCVD chamber. In order to prevent abnormal occurrence of crystalline nuclei due to impurities, it was exposed to HCl at 1,000° C. for 15 minutes so that its surface was cleansed. The temperature of the quartz glass substrate was lowered to 850° C. and a first growth was carried out under a pressure of 10 Torr.

As in Example 1, the molar ratio of the group V source to the group III source was 40 and sources of arsine, trimethyl-allium, trimethyl-aluminum and dimethylzinc were supplied for 1 hour. As a result, grains (not shown) with a diameter of about 30 $\mu$m composed of p-type AlGaAs (x=0.43) grew on the Si$_3$N$_4$ film 18. Incidentally, there was no difference in the grain size obtained, as between growth on a Si$_3$N$_4$ film and on a SiO$_2$ film. Subsequently, under atmospheric pressure, a p-type polycrystalline AlGaAs (x=0.43) layer 2 was grown at 800° C. and an n-type polycrystalline AlGaAs (x=0.43) layer 3 at 850° C., respectively.

A mesa structure 4 of 70 $\mu$m was formed by chemical etching. A p-type electrode 5 and an n-type electrode 6 were deposited on the etched surface and a part of the mesa structure 4, respectively. Measurement of the current-voltage characteristics of the device showed excellent commutation properties as in FIG. 2. The break down voltage was 6–8 V. The device emitted light only when a forward current was injected. The ratio of visible light emission intensity from the glass side to that from the semiconductor side was about 1:1. On the emission spectrum, two peaks appeared around 650 nm and around 760 nm as in Example 1 shown in FIG. 3. The peak at 650 nm is due to the band edge emission of AlGaAs (x=0.43) and that at 760 nm is due to a deep level emission.

Example 20

The present Example will be described with reference to FIG. 15. On a quartz glass plate 1 was deposited a Cr film 21 with a thickness of about 150 nm using a sputtering technique and this was used as a substrate. The temperature of the substrate was raised to 800° C. in an MOCVD chamber and the growth of a polycrystalline AlGaAs layer was conducted under a pressure of 10 Torr for 1 hour. As a result, grains (not shown) with a diameter of about 40 $\mu$m composed of AlGaAs (x=0.4) grew on the Cr film 21. Subsequently, under atmospheric pressure, a p-type polycrystalline AlGaAs (x=0.4) layer 22 was grown at 800° C. and an n-type polycrystalline AlGaAs (x=0.4) layer 23 at 850° C., respectively.

Figure 15:
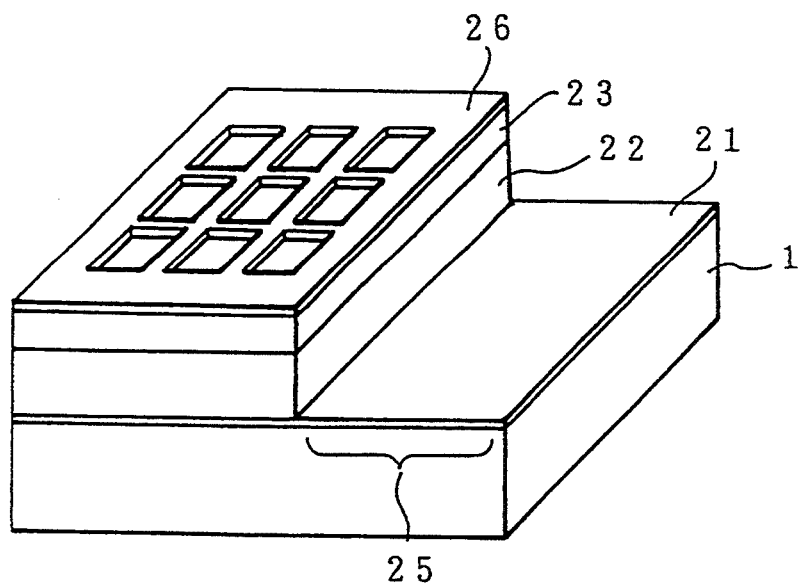
FIG. 15 is a perspective view of an AlGaAs polycrystalline light emitting diode described in Example 20, in which a Cr film covers the whole surface of a quartz glass plate, said Cr film being used as one electrode and another electrode being lattice-matching.

A schematic view of an LED produced by this example is shown in FIG. 15. Parts of the p-type polycrystalline AlGaAs (x=0.4) layer 22 and the n-type polycrystalline AlGaAs (x=0.4) layer 23 were etched using an etchant containing sulfuric acid until reaching the Cr film 21, to form an exposed area 25. An n-type electrode 26 with windows was deposited in order to take out light on the remaining n-type polycrystalline AlGaAs (x=0.4) layer 23. The Cr film 21 functions as an ohmic electrode for the p-type AlGaAs layer. Evaluation of the current-voltage characteristics of the device, showed excellent p-n characteristics as in FIG. 2. The device of the present example functioned as an LED. Visible light having a peak around 650 nm was emitted through the windows on the n-type electrode 26.

Example 21

Figure 16:
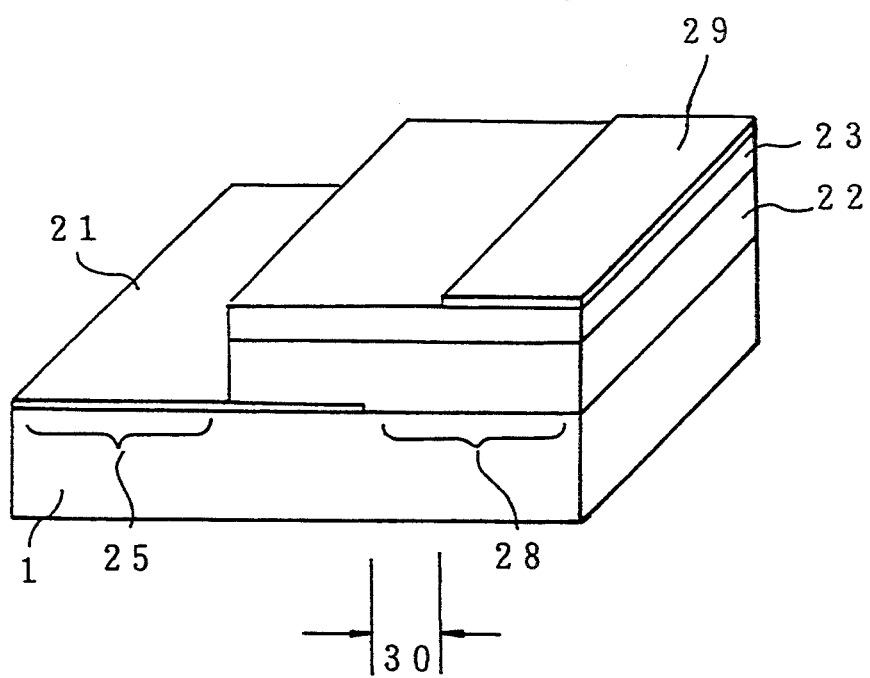
FIG. 16 is a perspective view of an AlGaAs polycrystalline light emitting diode described in Example 21, in which a Cr film is formed on a part of a quartz glass plate, said Cr film being used as one of electrodes, with stripe-like radiation being made between that electrode and another electrode.

FIG. 16 shows a perspective view of an LED of the present Example. A Cr film 21 with a thickness of about 150 nm was deposited by sputtering on a quartz glass plate 1. A portion 28 of plate 1 was exposed by removing a part of the Cr film 21 by conventional photo-lithography and etching. The temperature of the substrate was raised to 800° C. in an MOCVD chamber and an AlGaAs layer was grown under a pressure of 10 Torr for 1 hour. As a result, grains (not shown) with a diameter of about 40 μm composed of AlGaAs (x=0.4) grew on the Cr film 21 and grains (not shown) with a diameter of about 20 μm grew on the quartz glass plate 1, respectively. The AlGaAs layer had a Be dopant. Subsequently, under atmospheric pressure, a p-type polycrystalline AlGaAs (x=0.4) layer 22 was grown at 800° C. and an n-type polycrystalline AlGaAs (x=0.4) layer 23 was grown at 850° C., respectively.

A portion of the p-type polycrystalline AlGaAs (x=0.4) layer 22 and the n-type polycrystalline AlGaAs (x=0.4) layer 23 were removed using an etchant containing a sulfuric acid to produce an exposed portion 25 of the Cr film 21. A stripe-like n-type electrode 29 was deposited on a part of the remaining n-type polycrystalline AlGaAs (x=0.4) layer 23. A gap 30 of about 20 μm was formed between the electrode 29 composed of AlGaAs and the Cr film 21 on the substrate to provide for emission of the radiation. The Cr film 21 functions as an ohmic contact for the p-type polycrystalline AlGaAs layer 22. Evaluation of the current-voltage characteristics of the device, showed excellent p-n characteristics as in Example 20. The device of the present example functioned as an LED and luminescent light having a peak in the emission spectrum around 650 nm could be observed at the gap 30 from both the surface of the element 23 and the substrate 1.

Example 22

Figure 17:
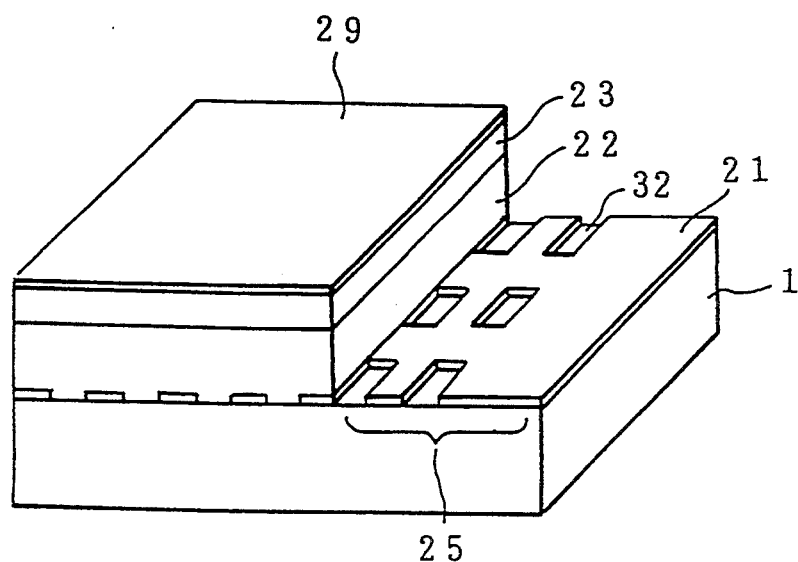
FIG. 17 is a perspective view of an AlGaAs polycrystalline light emitting diode described in Example 22, in which a lattice-like Cr film is formed on a part of a quartz glass plate, said Cr film being used as one of the electrodes.

FIG. 17 shows a perspective view of an LED of the present Example. A Cr film 21 with a thickness of about 150 nm was deposited on a quartz glass plate 1 according to a sputtering technique. Windows 32 were formed by conventional photo-lithography and etching. The temperature of the substrate was raised to 800° C. in an MOCVD chamber and the growth of grains (not shown) of AlGaAs was conducted under a pressure of 10 Torr for 1 hour. The grains of AlGaAs had Be dopant as a p-type carrier. Subsequently, under atmospheric pressure, a p-type polycrystalline AlGaAs (x=0.4) layer 22 was grown at 800° C. and an n-type polycrystalline AlGaAs (x=0.4) layer 23 was grown at 850° C., respectively.

In order to expose the Cr film 21 and fabricate a step 25, a portion of the p-type polycrystalline AlGaAs (x=0.4) layer 22 and the n-type polycrystalline AlGaAs (x=0.4) layer 23 were removed with an etchant containing sulfuric acid until reaching the lattice-like Cr film 21. An n-type electrode 29 was deposited over the whole surface of the remaining n-type polycrystalline AlGaAs (x=0.4) layer 23. Evaluation of the current-voltage characteristics of the device showed excellent p-n characteristics, similar to those obtained with the device in Example 20. The device of the present example functioned as an LED and an emission spectrum with a peak around 650 nm could be observed at the window 32 on the Cr film 21, from the direction of the substrate, upon current injection.

Example 23

Figure 18:
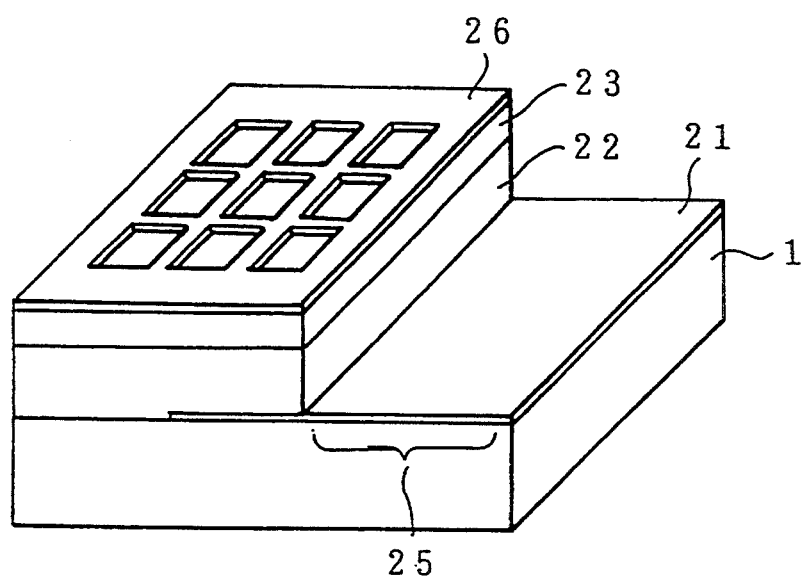
FIG. 18 is a perspective view of an AlGaAs polycrystalline light emitting diode described in Example 23, in which a Cr film is formed on a part of a quartz glass plate, said Cr film being used as one of the electrodes and another electrode being lattice-matching.

An LED was produced in the same manner as in Example 20. In Example 20 shown in FIG. 15, the Cr film 21 was prepared over the whole surface of the quartz glass plate 1. However, only a part of the quartz glass plate 1 was covered by Cr film 21 in the present Example. FIG. 18 shows a perspective view of the LED. Evaluation of the current-voltage characteristics of the device showed excellent p-n characteristics, similar to those of the device of Example 20. The device of the present structure functioned as an LED, with a peak emission around 650 nm observed from the windows fabricated on the n-type electrode 26 and the side of the quartz glass plate 1 not covered with the Cr film 21.

Incidentally, the Cr film 21 in the above Examples 20-23 had a thickness chosen to give a transmittance at the emission wavelengths of 10% or less.

Example 24

Figure 19:
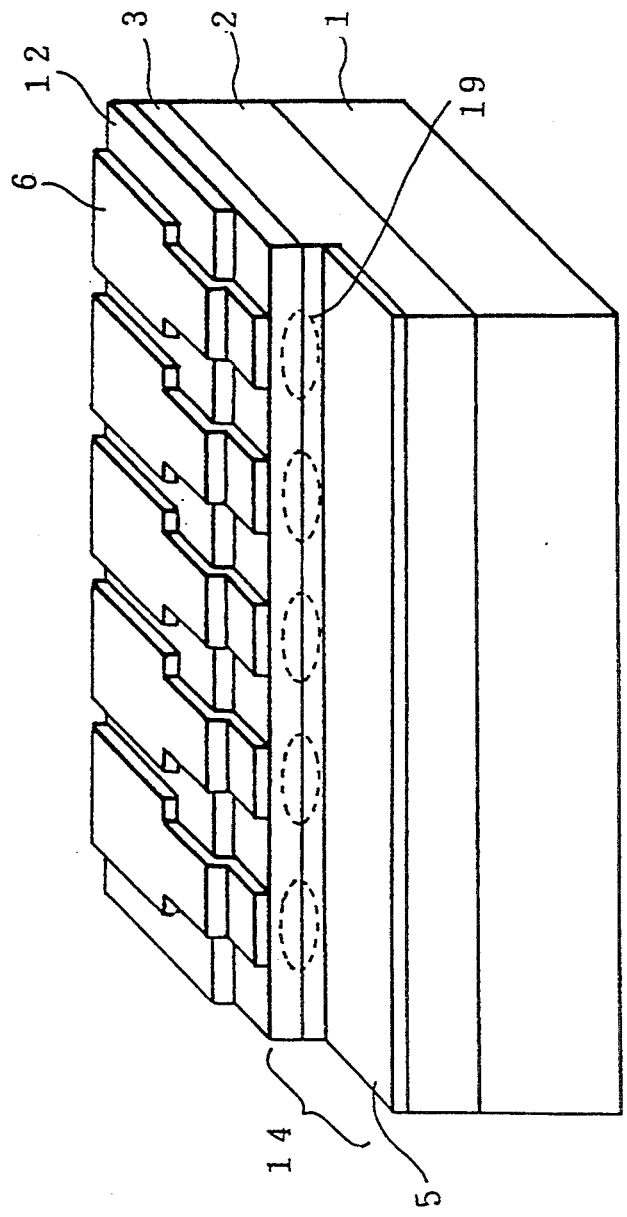
FIG. 19 is a schematic perspective view of an AlGaAs polycrystalline light emitting diode array fabricated on a quartz glass substrate as described in Example 24.

As an example of the present invention, the production of a p-n junction AlGaAs polycrystalline light emitting diode array on a quartz glass substrate will be described. FIG. 19 is a schematic perspective view of an AlGaAs polycrystalline light emitting diode array prepared on a quartz glass substrate 1. The quartz glass substrate 1 was subjected to etching with hydrofluoric acid as a pretreatment. Further, in order to prevent the abnormal occurrence of crystalline nuclei due to impurities, it was introduced into an MOCVD chamber and exposed to HCl at 1,000° C. for 15 minutes so that its surface was cleansed. The temperature of the substrate was lowered to 850° C. and a first growth was carried out under a pressure of 10 Torr. Here, as the group III sources were used trimethyl-gallium and trimethyl-aluminum, as the group V source was used arsine ($AsH_3$), as the p-type dopant was used dimethyl-zinc, as the n-type dopant was used hydrogen selenide and as a carrier gas was used hydrogen. The ratio of the group V source to the group III source, represented by the molar flow per unit time of the group V source to a molar flow per unit time of the group III source, was 40 and the sources and p-type dopant were supplied for 1 hour. As a result, grains (not shown) with a diameter of about 30 μm composed of p-type AlGaAs (x=0.43) grew on the quartz glass. In succession to the crystalline growth, under atmospheric pressure, a p-type polycrystalline AlGaAs (x=0.43) layer 2 was grown at 800° C. and an n-type polycrystalline AlGaAs (x=0.43) layer 3 at 850° C. respectively. This 2-step growth was conducted in order to obtain a p-type or n-type polycrystalline AlGaAs layer having excellent characteristics. The thickness of the p-type polycrystalline AlGaAs layer 2 was about 3.5 μm and that of the n-type polycrystalline AlGaAs layer 3 was about 1 μm.

Subsequently, step 14 was formed by chemical etching and on the etched surface was formed a p-type electrode 5. Here, as the etching depth was about 1.5 μm, n-type polycrystalline AlGaAs layer 3 could be removed. A $SiO_2$ film 12 of about 0.5 μm was prepared as an insulating film on a part of the unetched portion and an n-type electrode 6 having the structure shown in FIG. 19 was formed. Light was emitted at a p-n junction below the electrode 6 (part 19 surrounded with dots in FIG. 19) by injecting a forward current between the electrode 5 and the electrode 6 and the emitted light was visible and observed from the etched side (corresponding to the part 19 in FIG. 19) and through the substrate. The present device could be modified with regard to light emitting point according to the choice of an n-type electrode 6 and simultaneous lighting was also possible.

Example 25

Figure 20:
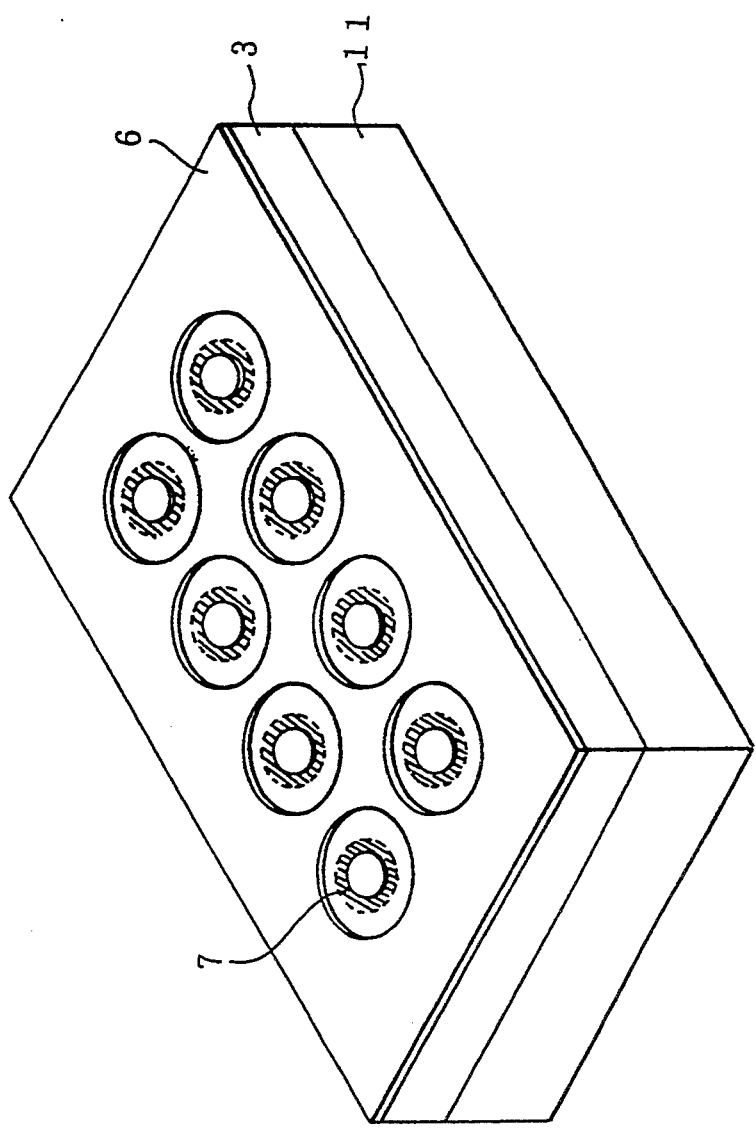
FIG. 20 is a schematic perspective view of an array of AlGaAs polycrystalline light emitting diode described in Example 24, in which a p-n junction is fabricated on a multicomponent glass substrate by Zn diffusion.
Figure 21A:
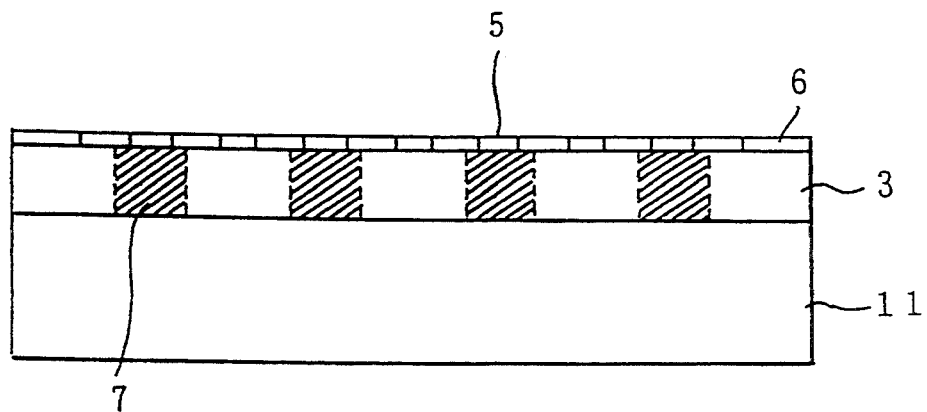
FIGS. 21(a) and 21(b) are schematic views of an array of an AlGaAs polycrystalline light emitting diode described in Example 25, in which a p-n junction is fabricated on a multicomponent glass substrate by Zn diffusion.
Figure 21B:
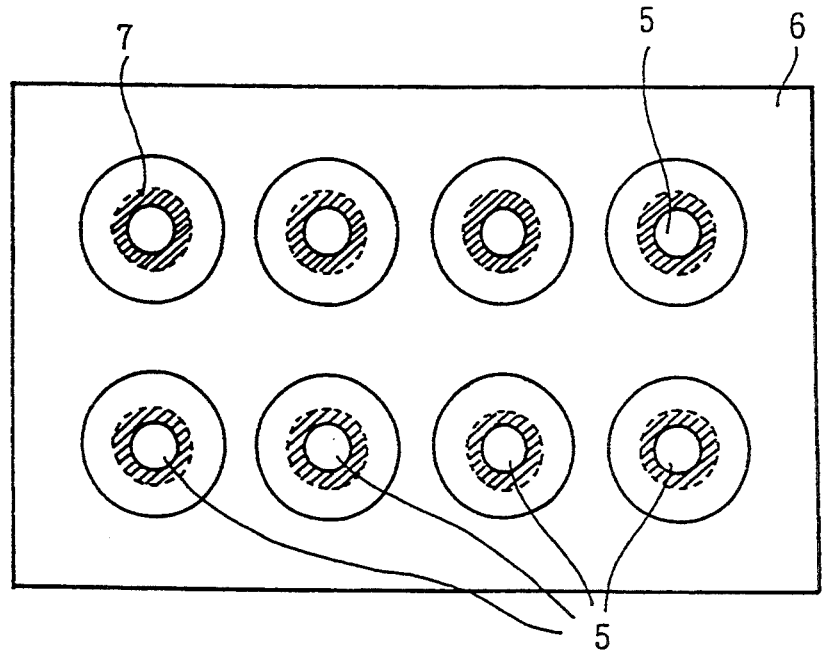

In this example an AlGaAs polycrystalline light emitting diode array is formed on a multicomponent glass substrate 11 of the type described in Example 9. FIG. 20 is a schematic perspective view of a light emitting diode array produced according to the present Example; FIG. 21(a) is its schematic sectional view and FIG. 21(b) is its schematic plan view. The multicomponent glass substrate 11 was subjected to etching with dilute hydrofluoric acid as a pretreatment. The temperature of the substrate was lowered to 850° C. and a first growth was carried out under a pressure of 10 Torr. As in Example 1, the ratio of the group V source to the group III source was 40 and these sources and n-type dopant were supplied for 1 hour. As a result, grains (not shown) with a diameter of about 30 $\mu$m composed of n-type AlGaAs (x=0.43) grew on the multicomponent glass substrate 11. Subsequently, under atmospheric pressure, 3 $\mu$m of an n-type polycrystalline AlGaAs (x=0.43) layer 3 was grown at 800° C.

A $Si_3N_4$ layer (not shown) was deposited on the substrate using a CVD method. A diffusion window was opened in the $Si_3N_4$ layer photo-lithographically. Zn was diffused on a part of an AlGaAs layer, through the windows opened in the $Si_3N_4$, using a closed tube technique. p-type electrodes 5 were deposited on a part of Zn diffusion regions 7 (part with oblique lines in FIG. 20 and FIG. 21) and n-type electrodes 6 were deposited on a non-diffusion region, respectively. Here, p-n junctions formed by the diffusion are encircled and are located between the p-type electrode 5 and the n-type electrode 6. Measurement of the current-voltage characteristics of the electrode 6 and the electrode 5 indicated the same commutation properties as in FIG. 2. The light emission between the electrode 5 and the electrode 6, corresponding to the p-n junction, occurred only when a forward current was injected and doughnut-like visible luminescent light was observed. In addition, light emission could also be observed through the glass 11.

What is claimed is:

1. A semiconductor light emitting device comprising:
   a substrate;
   p-type or n-type non-epitaxial polycrystalline grains formed on the substrate;
   p-type and n-type polycrystalline, semiconductor layers formed on said substrate and comprising at least one junction, one of said semiconductor layers being formed on said grains and having the same composition as said grains; and
   a single first electrode for the entirety of said p-type semiconductive layer and a single second electrode for the entirety of said n-type semiconductive layer.

2. A semiconductor light emitting device in accordance with claim 1 wherein said junction is a pn or pin junction.

3. A semiconductor light emitting device in accordance with claim 1 further comprising a metal layer intermediate said substrate and said grains, said metal layer serving as the electrode for said one semiconductor layer and said metal layer being transparent to light emitted upon application of an electric current to said junction.

4. A semiconductor light emitting device in accordance with claim 1 wherein said substrate is a material free from epitaxial growth and is selected from the group consisting of polycrystalline ceramics and amorphous glasses.

5. A semiconductor light emitting device in accordance with claim 1 wherein said n-type semiconductor layer is AlGaAs with an n-type dopant and said p-type semiconductor layer is AlGaAs with a p-type dopant.

6. A semiconductor light emitting device in accordance with claim 1, wherein the electrode for said one semiconductor layer is coextensive with said one semiconductor layer.

* * * * *

UNITED STATES PATENT AND TRADEMARK OFFICE
CERTIFICATE OF CORRECTION

PATENT NO. : 5,418,395
DATED : May 23, 1995
INVENTOR(S) : NAGATA et al

It is certified that error appears in the above-indentified patent and that said Letters Patent is hereby corrected as shown below:

Col. 12, line 64, "$\mu$m" should read --$\mu$m$\phi$--.

Col. 16, line 16, "$\mu$m" should read --$\mu$m$\phi$--.

Signed and Sealed this

Twenty-first Day of November, 1995

Attest:

BRUCE LEHMAN

Attesting Officer

Commissioner of Patents and Trademarks